United States Patent
Intrater (10) Patent No.: US 11,681,352 B2
(45) Date of Patent: Jun. 20, 2023

(54) STANDBY CURRENT REDUCTION IN MEMORY DEVICES

(71) Applicant: Adesto Technologies Corporation, Santa Clara, CA (US)

(72) Inventor: Gideon Intrater, Sunnyvale, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 106 days.

(21) Appl. No.: 17/034,154

(22) Filed: Sep. 28, 2020

(65) Prior Publication Data

US 2021/0157389 A1 May 27, 2021

Related U.S. Application Data

(60) Provisional application No. 62/940,334, filed on Nov. 26, 2019.

(51) Int. Cl.
| | | |
|---|---|---|
| G06F 1/3234 | (2019.01) | |
| G06F 1/3225 | (2019.01) | |
| G11C 11/4074 | (2006.01) | |
| G11C 8/18 | (2006.01) | |
| G11C 11/409 | (2006.01) | |
| G11C 5/14 | (2006.01) | |
| G11C 11/4076 | (2006.01) | |
| G06F 13/00 | (2006.01) | |
| G06F 1/3206 | (2019.01) | |
| G06F 1/3203 | (2019.01) | |
| G06F 3/06 | (2006.01) | |

(52) U.S. Cl.
CPC .......... *G06F 1/3275* (2013.01); *G06F 1/3225* (2013.01); *G11C 5/148* (2013.01); *G11C 8/18* (2013.01); *G11C 11/409* (2013.01); *G11C 11/4074* (2013.01); *G11C 11/4076* (2013.01); *G06F 1/3203* (2013.01); *G06F 1/3206* (2013.01); *G06F 3/0679* (2013.01); *G06F 13/00* (2013.01)

(58) Field of Classification Search
CPC .... G06F 1/3206; G06F 1/3203; G06F 1/3275; G06F 1/3225; G06F 13/00; G06F 3/0679; G11C 8/18; G11C 11/4076; G11C 11/4074; G11C 11/409
USPC .................................................. 713/320, 323
See application file for complete search history.

(56) References Cited

U.S. PATENT DOCUMENTS

| | | |
|---|---|---|
| 6,321,315 B1 | 11/2001 | LaBerge |
| 7,292,494 B2 | 11/2007 | Hsu et al. |
| 7,372,716 B2 | 5/2008 | Roehr et al. |
| 7,397,721 B2 | 7/2008 | Lee |
| 7,436,699 B2 | 10/2008 | Tanizaki et al. |
| 7,562,180 B2 | 7/2009 | Gyl et al. |
| 7,593,263 B2 | 9/2009 | Sokolov et al. |
| 8,787,097 B1 * | 7/2014 | Chong ................. G11C 7/1066 365/194 |

(Continued)

*Primary Examiner* — Ji H Bae (57) ABSTRACT

A method of controlling a memory device can include: determining, by the memory device, a time duration in which the memory device is in a standby mode; automatically switching the memory device from the standby mode to a power down mode in response to the time duration exceeding a predetermined duration; exiting from the power down mode in response to signaling from a host device via an interface; and toggling a data strobe when data is ready to be output from the memory device in response to a read command from the host device.

14 Claims, 10 Drawing Sheets

(56) References Cited

U.S. PATENT DOCUMENTS

| | | | |
|---|---|---|---|
| 8,806,071 B2 | 8/2014 | Zitlaw | |
| 8,966,151 B2 | 2/2015 | Zitlaw | |
| 9,037,890 B2 | 5/2015 | De Caro et al. | |
| 9,454,421 B2 | 9/2016 | McClain et al. | |
| 9,812,183 B2 | 11/2017 | Intrater et al. | |
| 9,812,200 B2 | 11/2017 | Intrater et al. | |
| 10,290,334 B2 | 5/2019 | Intrater et al. | |
| 10,613,763 B2 | 4/2020 | Intrater | |
| 10,726,888 B2 | 7/2020 | Intrater et al. | |
| 2009/0153253 A1* | 6/2009 | Mei | H03L 7/081 331/10 |
| 2010/0124102 A1 | 5/2010 | Lee et al. | |
| 2013/0083611 A1* | 4/2013 | Ware | G11C 11/4076 365/191 |
| 2014/0189415 A1* | 7/2014 | Chen | G06F 1/08 713/600 |
| 2014/0254238 A1 | 9/2014 | Gilbert et al. | |
| 2015/0143020 A1 | 5/2015 | Ferreira et al. | |
| 2015/0241956 A1 | 8/2015 | De Caro et al. | |
| 2016/0154454 A1* | 6/2016 | Tu | G06F 3/0625 713/323 |
| 2017/0040057 A1* | 2/2017 | Cho | G06F 13/1694 |
| 2017/0206031 A1* | 7/2017 | Yin | G06F 1/3275 |
| 2018/0107417 A1* | 4/2018 | Shechter | G06F 3/0619 |
| 2021/0334028 A1* | 10/2021 | Ellis | G06F 3/0679 |

\* cited by examiner

STANDBY CURRENT REDUCTION IN MEMORY DEVICES

RELATED APPLICATIONS

This application claims the benefit of U.S. Provisional Application No. 62/940,334, filed Nov. 26, 2019, and which is incorporated herein by reference in its entirety.

FIELD OF THE INVENTION

The present invention generally relates to the field of semiconductor devices. More specifically, embodiments of the present invention pertain to memory devices, including both volatile and non-volatile memory devices, such as flash memory devices, resistive random-access memory (ReRAM), and/or conductive bridging RAM (CBRAM) processes and devices.

BACKGROUND

Non-volatile memory (NVM) is increasingly found in applications, such as solid-state hard drives, removable digital picture cards, automotive electronics, home appliances, and so on. Flash memory is the predominant NVM technology in use today. However, flash memory has limitations, such as a relatively high power, as well as relatively slow operation speed. Microprocessor performance can be very sensitive to memory latency. Many non-volatile memory devices have an access time or latency that is relatively slow as compared to the microprocessor. In addition, many implementations of various communication protocols between a microprocessor/host and memory, such as serial peripheral interface (SPI) can add even more latency than is required by the memory array itself.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to memory devices, including volatile memory, such as SRAM and DRAM, and including non-volatile memory (NVM), such as flash memory devices, and/or resistive switching memories (e.g., conductive bridging random-access memory [CBRAM], resistive RAM [ReRAM], etc.). Particular embodiments can include structures and methods of operating flash and/or resistive switching memories that can be written (programmed/erased) between one or more resistance and/or capacitive states. In one particular example, a CBRAM storage element may be configured such that when a forward or reverse bias greater than a threshold voltage is applied across electrodes of the CBRAM storage element, the electrical properties (e.g., resistance) of the CBRAM storage element can change. In any event, certain embodiments are suitable to any type of memory device, and in particular NVM devices, such as flash memory devices, and may include resistive switching memory devices in some cases.

Figure 1:
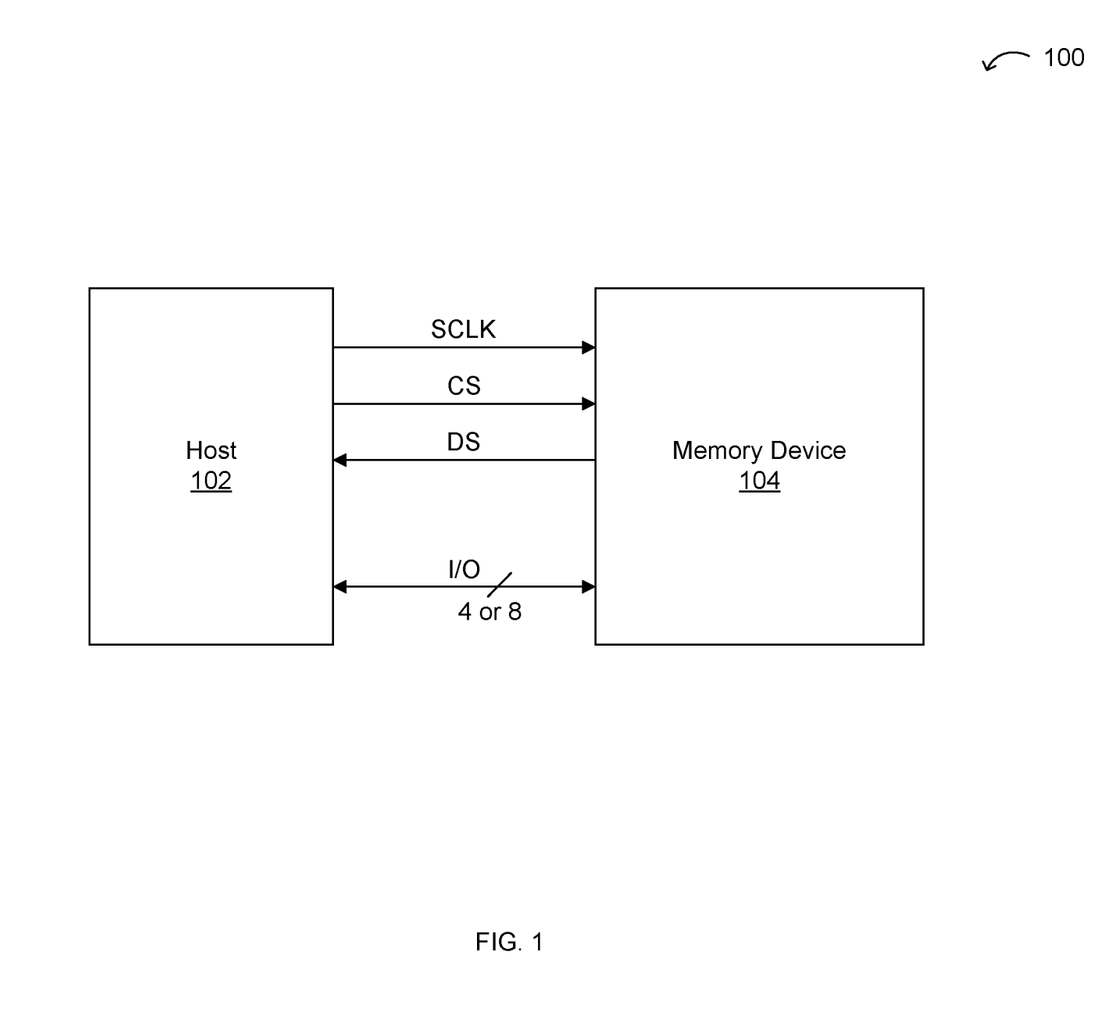
FIG. 1 is a schematic block diagram of an example host and memory device arrangement, in accordance with embodiments of the present invention.

Referring now to FIG. 1, shown is an example memory device and host arrangement 100, in accordance with embodiments of the present invention. In this example, host 102 can interface with memory device 104 via a serial interface. For example, host 102 can be any suitable controller (e.g., CPU, MCU, general-purpose processor, GPU, DSP, etc.), and memory device 104 can be any type of memory device (e.g., SRAM, DRAM, EEPROM, Flash, CBRAM, magnetic RAM, ReRAM, etc.). Memory device 104 can thus be implemented in a variety of memory technologies, such as non-volatile types. In some cases, memory device 104 can be a serial flash memory that may be implemented in more traditional non-volatile memories, or in CBRAM/ReRAM resistive switching memories.

Various interface signals, such as in a serial peripheral interface (SPI), can be included for communication between host 102 and memory device 104. For example, serial clock (SCK) can provide a clock to device 104, and may be used to control the flow of data to the device. Command, address, and input data (e.g., via I/O pins) can be latched by memory device 104 on a rising edge of SCK, while output data (e.g., via I/O pins) can be clocked out of memory device 104 by SCK or data strobe (DS). Chip select (CS), which may be active low, can be utilized to select memory device 104, such as from among a plurality of such memory devices sharing a common bus or circuit board, or otherwise as a way to access the device. When the chip select signal is de-asserted (e.g., at a high level), memory device 104 can be deselected, and placed in a standby mode. Activating the chip select signal (e.g., via a high to low transition on CS) may be utilized to start an operation, and returning the chip select signal to a high state can be utilized for terminating an operation. For internally self-timed operations (e.g., a program or erase cycle), memory device 104 may not enter standby mode until completion of the particular ongoing operation if chip select is de-asserted during the operation.

In the example interface, data can be provided to (e.g., for write operations, other commands, etc.) and from (e.g., for read operations, verify operations, etc.) memory device 104 via the I/O signals. For example, input data on the I/O can be latched by memory device 104 on edges of serial clock SCK, and such input data can be ignored if the device is deselected (e.g., when the chip select signal is de-asserted). Data can be output from memory device 104 via the I/O signals as well. For example, data output from memory device 104 can be clocked out on edges of DS or SCK for timing consistency, and the output signal can be in a high impedance state when the device is deselected (e.g., when the chip select signal is de-asserted). For example, input data may be clocked either on one edge (SDR/STR) or both edges (DDR/DTR) of SCK for command, address, or data, or a combination of both. Similarly, output data may be clocked on either one edge (SDR/STR) or both edges (DDR/DTR) of SCK or DS for data. Further, output data may, but is not required to, use the same clocking mode as the input data. Also, in some devices/arrangements, DS can be an optional signal. Further, while 4 or 8 I/O lines are shown in the particular example of FIG. 1, any number of I/O lines (e.g., 1, 2, 4, 8, 16, etc.) can be supported in certain embodiments.

Figure 2:
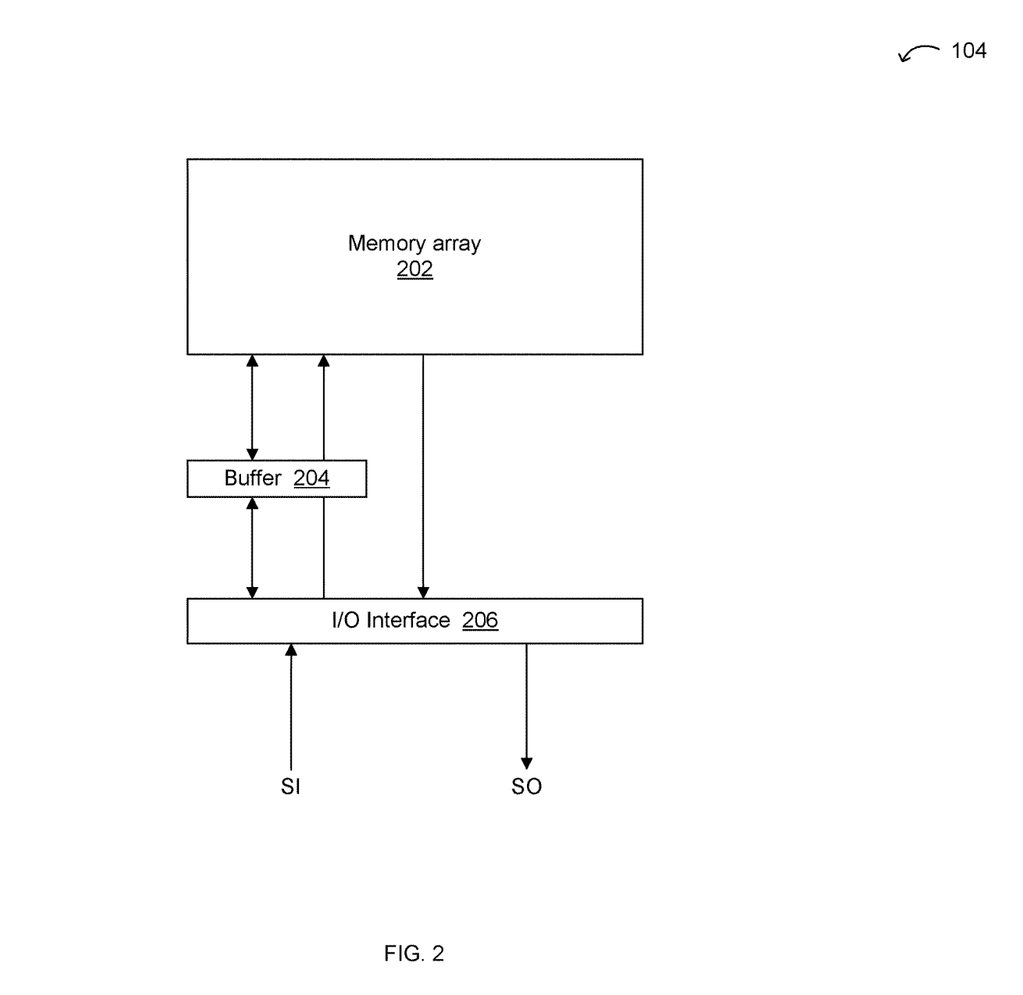
FIG. 2 is a schematic block diagram of an example memory device structure with a data buffer, in accordance with embodiments of the present invention.

Referring now to FIG. 2, shown is a schematic block diagram of an example memory device 104 structure with a data buffer, in accordance with embodiments of the present invention. For example, memory device 104 can include memory array 202, buffer 204 (e.g., SRAM or other fast access memory), and I/O interface 206. In some arrangements, more than one buffer 204 can be provided, such as a buffer for an input path, and another buffer for an output path. Alternatively, or in addition, multiple buffers can be provided for multi-layer buffering. For example, memory device 104 can be configured as a data flash and/or a serial flash device. Memory array 202 can be organized as any suitable number of pages of data. For example, each page can include 256 or 264 bytes of data. Similarly, buffer 204 can store at least a page of data. I/O interface 206 can provide interfacing between memory array 202, buffer 204, and serial data input (SI) and output (SO). For example, I/O interface 206 may be part of an SPI or other serial type of interface, and may also support a number of SPI interface modes (e.g., Single SPI, QPI, Octal, x16 modes, etc.).

Figure 3:
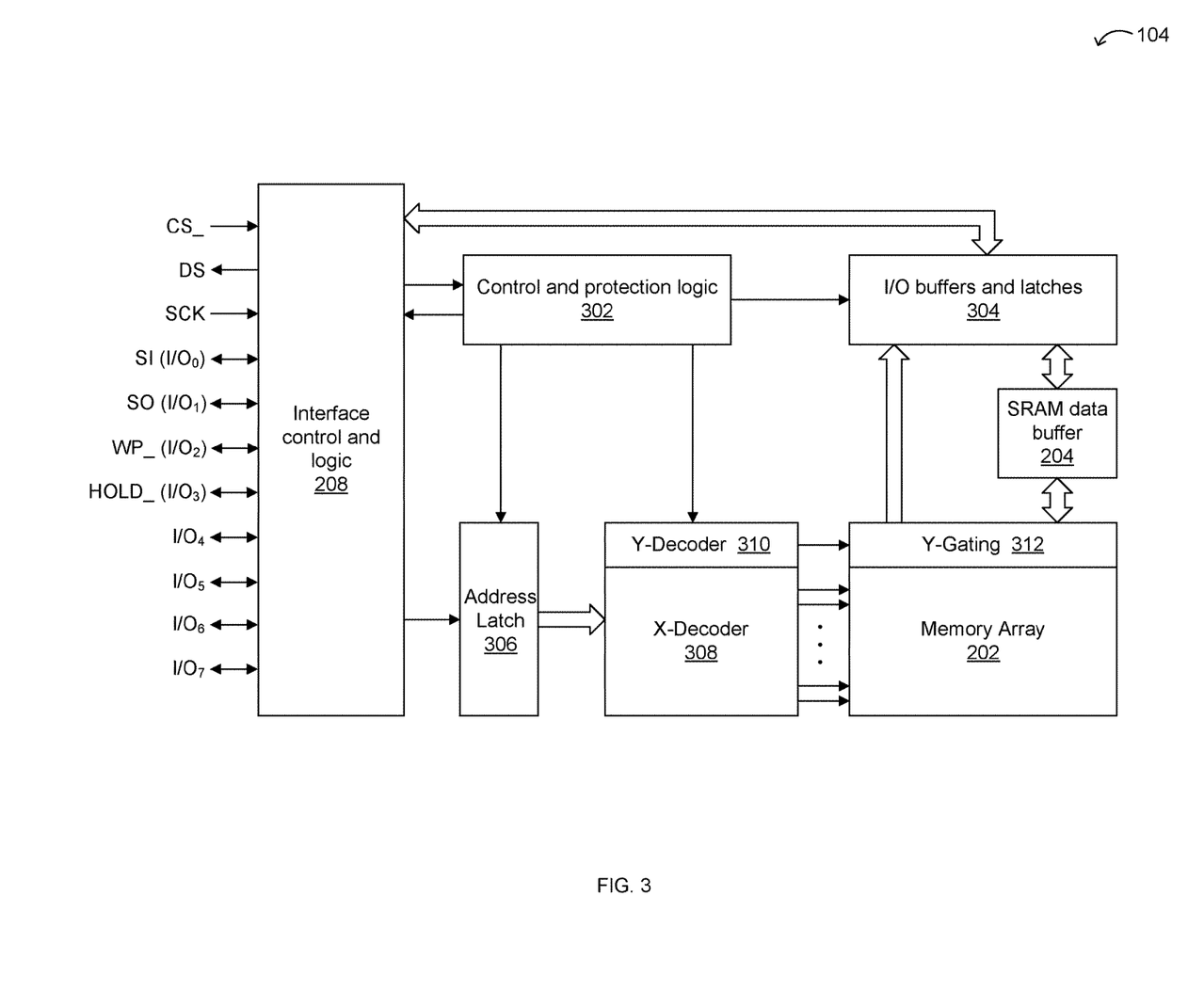
FIG. 3 is a schematic block diagram of an example memory device, in accordance with embodiments of the present invention.

Referring now to FIG. 3, shown is a schematic block diagram of an example memory device, in accordance with embodiments of the present invention. Memory device 104 can include interface control and logic 208, which may manage the interface (e.g., SPI interface), and decode the command and address information. Control and protection logic 302 can include control circuitry for reading and writing to the memory array, including address mapping and control for byte access and group addressing/ordering, as will be discussed in more detail below. For example, control and protection logic 302 can include a command decoder, registers for command execution parameters (e.g., read parameters, program/erase parameters, etc.), as well as a controller for command execution.

I/O buffers and latches 304 can control the input of data from interface control and logic 208, and the output of data to interface control and logic 208. For example, chip select based control and clock based control of data read from memory array 202 can be accommodated via I/O buffers and latches 304. That is, registers/latches in I/O buffers and latches 304 can be controlled by way of the toggling of serial clock SCK during burst reads and sequential fetch operations, as described herein. SRAM data buffer(s) 204 can buffer/store data between memory array 202 and I/O buffers and latches 304. Address latch block 306 can receive address information via interface control and logic 208, and may provide latched addresses to X-decoder 908 for row addresses, and to Y-decoder 310 for column addresses. Incrementing of addresses can be performed via address latch block 306 and/or control and protection logic 302. Y-decoder 310 can provide column addresses to Y-Gating 312, which can include pass gates or the like to multiplex I/O lines to/from memory array 202. As discussed above, memory array 202 can include an array of volatile memory cells, or non-volatile memory cells (e.g., CBRAM, ReRAM, Flash, etc.).

Standby Current Reduction

In order to perform read operations on a standalone non-volatile memory (NVM) device (e.g., 104), such a memory device may require a power-hungry charge pump, band gap, and/or other circuits. In existing NVM devices, these circuits may not be turned off during standby because a read request may arrive at any time, and it can take too long for the memory device to turn these circuits on to support the incoming read request. Accordingly, systems that spend relatively long periods of time without needing to access an external NVM (e.g., because they run primarily from internal memory, are in a standby mode, etc.) can consume excess power.

In one approach, the read charge pump, band gap, and other circuits can be turned off by switching the NVM device to power down mode by software control. For example, this can be done by an explicit command that is typically initiated by software. However, in eXecute-in-Place (XiP) mode, where there is no a-priori knowledge of when an instruction-cache miss will occur and thereby when a read request may be initiated, software may not be utilized to insert a wake-up command.

Particular embodiments can include an automatic switching to power down mode for power savings in the memory device. For example, a data strobe signal (e.g., part of the JEDEC xSPI spec) may be utilized in some cases. Certain embodiments also support modifications to the host controller (e.g., 102) and/or to the memory device (e.g., 104), in order to implement the power down entry/exit as described herein. In one embodiment, the host controller can be modified to accommodate switching to the power down mode, and exiting therefrom. In another embodiment, the memory device can be modified for automatic switching to the power down mode, as well as exiting therefrom. Such implementations may be compatible with existing xSPI host controllers, whereby the XiP system is designed such that longer cache-miss latency can be tolerated in certain situations. Further, the data strobe signal can be utilized, such as to indicate to the host that data is ready to be output from the memory device.

In one embodiment, a method of controlling a memory device can include: (i) determining, by the memory device, a time duration in which the memory device is in a standby mode; (ii) automatically switching the memory device from the standby mode to a power down mode in response to the time duration exceeding a predetermined duration; (iii) exiting from the power down mode in response to signaling from a host device via an interface; and (iv) toggling a data strobe when data is ready to be output from the memory device in response to a read command from the host device.

In one embodiment, a memory device can include: (i) a counter circuit configured to determine a time duration in which the memory device is in a standby mode; (ii) a controller configured to automatically switch the memory device from the standby mode to a power down mode in response to the time duration exceeding a predetermined duration; (iii) the controller being configured to exit from the power down mode in response to signaling from a host device via an interface; and (iv) a data path circuit configured to toggle a data strobe when data is ready to be output from the memory device in response to a read command.

In one embodiment, a host device can include: (i) a counter circuit configured to determine a time duration in which a memory device is in a standby mode, wherein the host device is coupled to the memory device via an interface; (ii) a controller configured to send a power down command to the memory device via the interface in response to the time duration exceeding a predetermined duration; (iii) the controller being configured to send a wake-up command to the memory device to exit from the power down mode; and (iv) a data path circuit configured to send a read command to the memory device after the memory device has returned to the standby mode.

Figure 4:
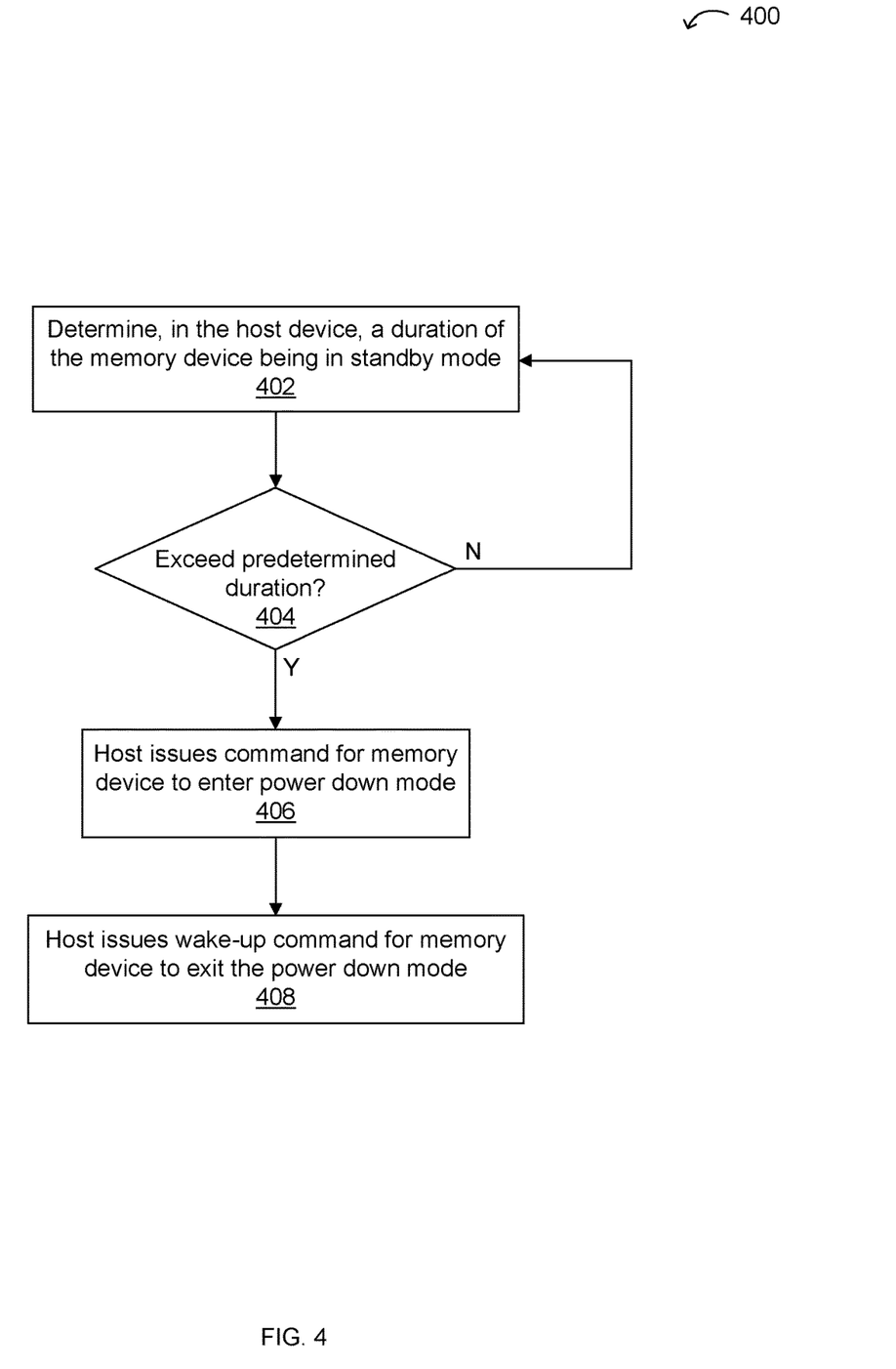
FIG. 4 is a flow diagram of an example method of a host controlling standby current reduction in a memory device, in accordance with embodiments of the present invention.

Referring now to FIG. 4, shown is a flow diagram of an example method of a host controlling standby current reduction in a memory device, in accordance with embodiments of the present invention. In example 400, the host device can determine a duration in which the memory device is in the standby mode at 402. This duration can be compared against a predetermined duration at 404, in order to determine whether the memory device has been in the standby mode for a sufficiently "long" time. In this case, the host device can determine that the memory device can enter the power down mode since there has been no access thereof for this predetermined long period of time. At 406, the host device can issue a command to the memory device to enter the power down mode. As discussed above, the power down mode can include the disabling of one or more circuits (e.g., charge pump, band gap reference generator, etc.) on the memory device in order to save power. Sometime later, at 408, the host can issue a wake-up command for the memory device to exit power down mode. This can occur when the host expects to issue a new command to access (e.g., read data from) the memory device.

In this particular case, the host controller can be changed to accommodate the function of determining when the memory device has been in standby mode for a sufficiently long time such that the power down command can be issued, and with no change to the corresponding NVM. In this way, the host controller can detect a pre-specified "long" period of time in which no accesses were made to the NVM, and then can send a command to the NVM to switch to a "power down" mode. As a result, the use of unnecessary power in the memory device can be avoided in cases whereby the memory device is not to be accessed for this long period of time. It should be noted that, while changes to either the host device or the memory device are independently discussed herein, both the host device and the memory device can include modifications to implement certain embodiments in some cases.

Figure 5:
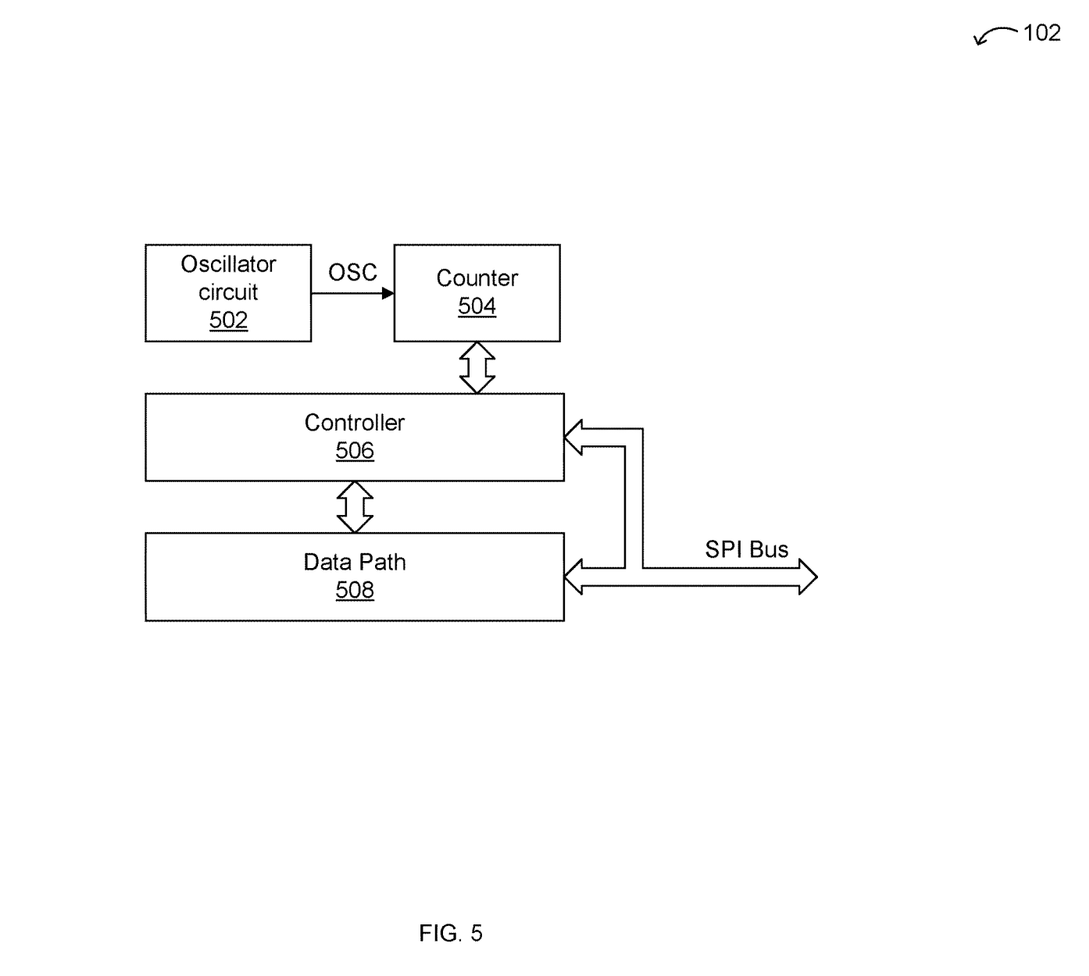
FIG. 5 is a schematic block diagram of an example host device configured to control standby current reduction, in accordance with embodiments of the present invention.

Referring now to FIG. 5, shown is a schematic block diagram of an example host device configured to control standby current reduction, in accordance with embodiments of the present invention. In this particular example, oscillator 502 can generate an internal oscillator signal OSC for counter 504. Any suitable oscillating signal (e.g., a system clock if ongoing, etc.) can be utilized in certain embodiments. For example, oscillator circuit 502 can be an on-chip oscillator that may also be employed for timing other operations on the host device, or a separate oscillator circuit. Counter 504 can count a number of cycles of the oscillator signal in order to determine a time duration in which the memory device has been in the standby mode. It should be noted that any type of counting, or any circuitry that can correlate with a time duration, may be utilized in certain embodiments. In any event, if this determined time duration exceeds a predetermined duration, controller 506 and/or via data path 508 can issue commands on the interface (e.g., SPI bus) to instruct the memory device to enter the power down mode. Controller 506 and/or via data path 508 can subsequently issue commands on the interface (e.g., SPI bus) in order to instruct the memory device to exit (wake-up) from the power down mode in anticipation of a new access.

Figure 6:
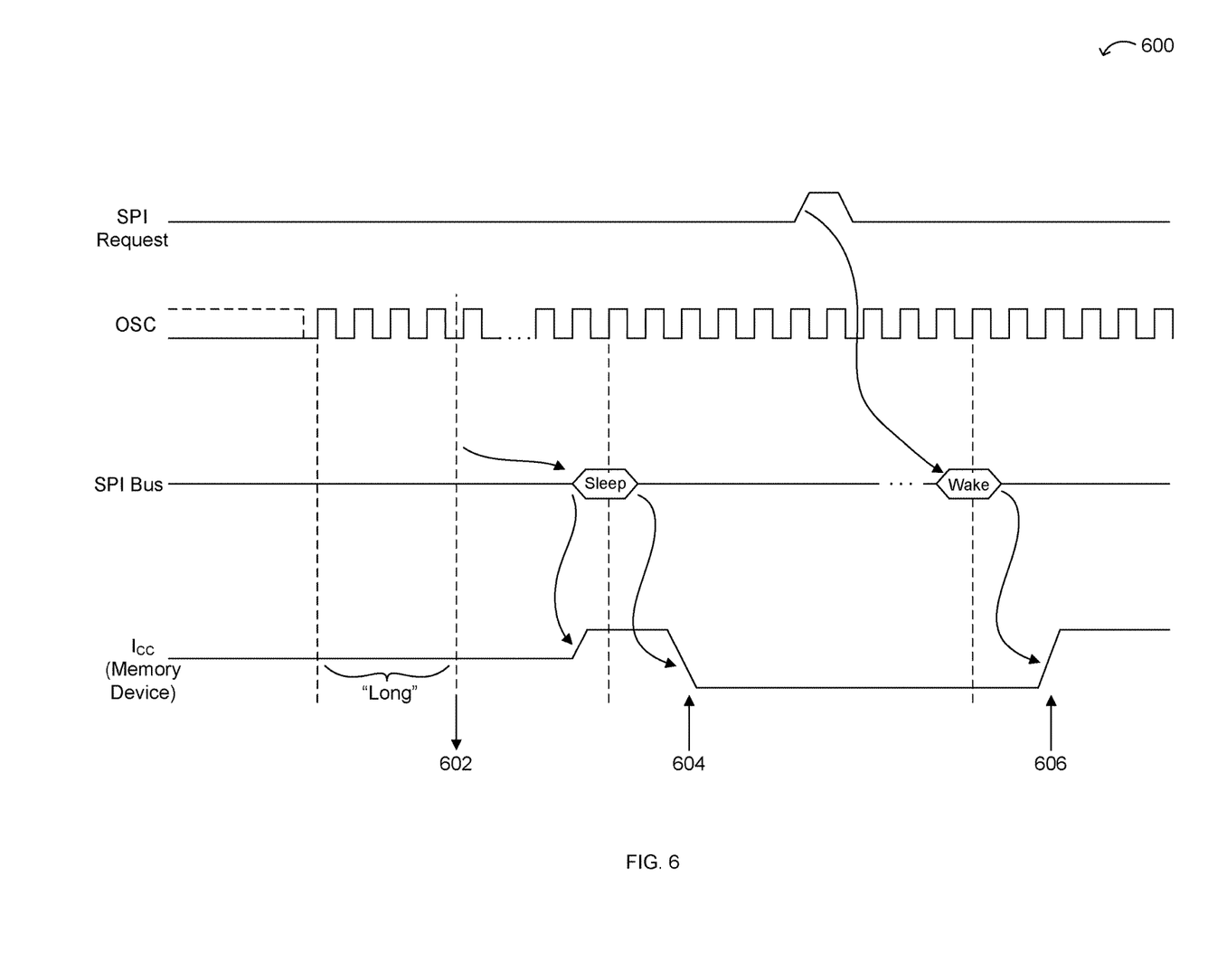
FIG. 6 is a waveform diagram of an example host control of standby current reduction in a memory device, in accordance with embodiments of the present invention.

Referring now to FIG. 6, shown is a waveform diagram of an example host control of standby current reduction in a memory device, in accordance with embodiments of the present invention. In order to switch out of the power down mode, in the case whereby the host controller is changed to implement power down mode entry/exit as described herein (e.g., with no change to the NVM), the host can send a wake-up command to the memory device to exit from the power down mode. For example, the host controller may detect an NVM read request intended for the memory device, can send a "wake-up" command to the NVM. The host controller may wait until the NVM is "awake," and then can send the original read request to the NVM.

In example 600, the memory device can be in a standby mode until time 602 when the duration of this standby mode has been determined by the host device to exceed a predetermined duration. As discussed above, this determination can include counting a number of clock cycles during which the memory device is in a standby mode and that exceed a predetermined number. This duration is indicated in the diagram as "Long." As a result, the host device can prepare to send a sleep command to the memory device, which can also increase the ICC of the memory device to a level above the standby mode current such that the incoming command can be detected. The host device may issue this sleep command that results in the memory device entering power down mode at 604. During the power down mode, various circuits (e.g., charge pumps, band gap generators, etc.) can be disabled on the memory device in order to reduce the current drawn by the memory device to a lower level, as shown at 604. This status can remain until an SPI bus request (e.g., a pulse signal) is received in the host device to indicate that a request for an SPI access is to come from the host device. For example, a bus master may send this SPI bus request signal to the host device. In response, the host device can provide a wake-up command to the memory device in order to exit from the power down mode at 606.

Figure 7:
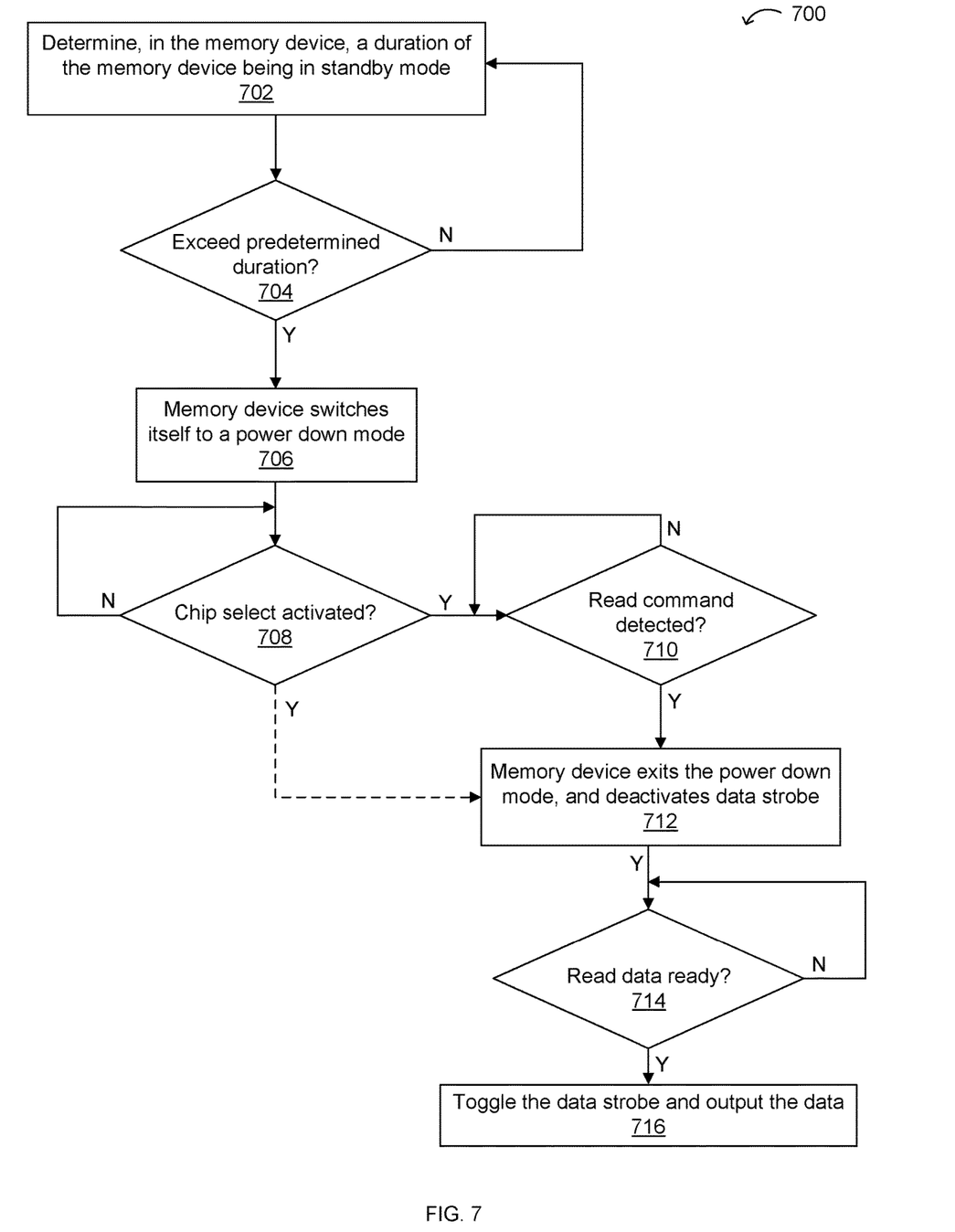
FIG. 7 is a flow diagram of an example method of a memory device automatically reducing standby current, in accordance with embodiments of the present invention.

Referring now to FIG. 7, shown is a flow diagram of an example method of a memory device automatically reducing standby current, in accordance with embodiments of the present invention. In this case, there may be no change to the host controller, but rather the NVM device can be changed in order to implement power down mode entry/exit as discussed herein. In particular embodiments, the NVM device can detect a pre-specified "long" period of time in which no accesses were made to the NVM, and may automatically switch itself to a "power down" mode.

Figure 8:
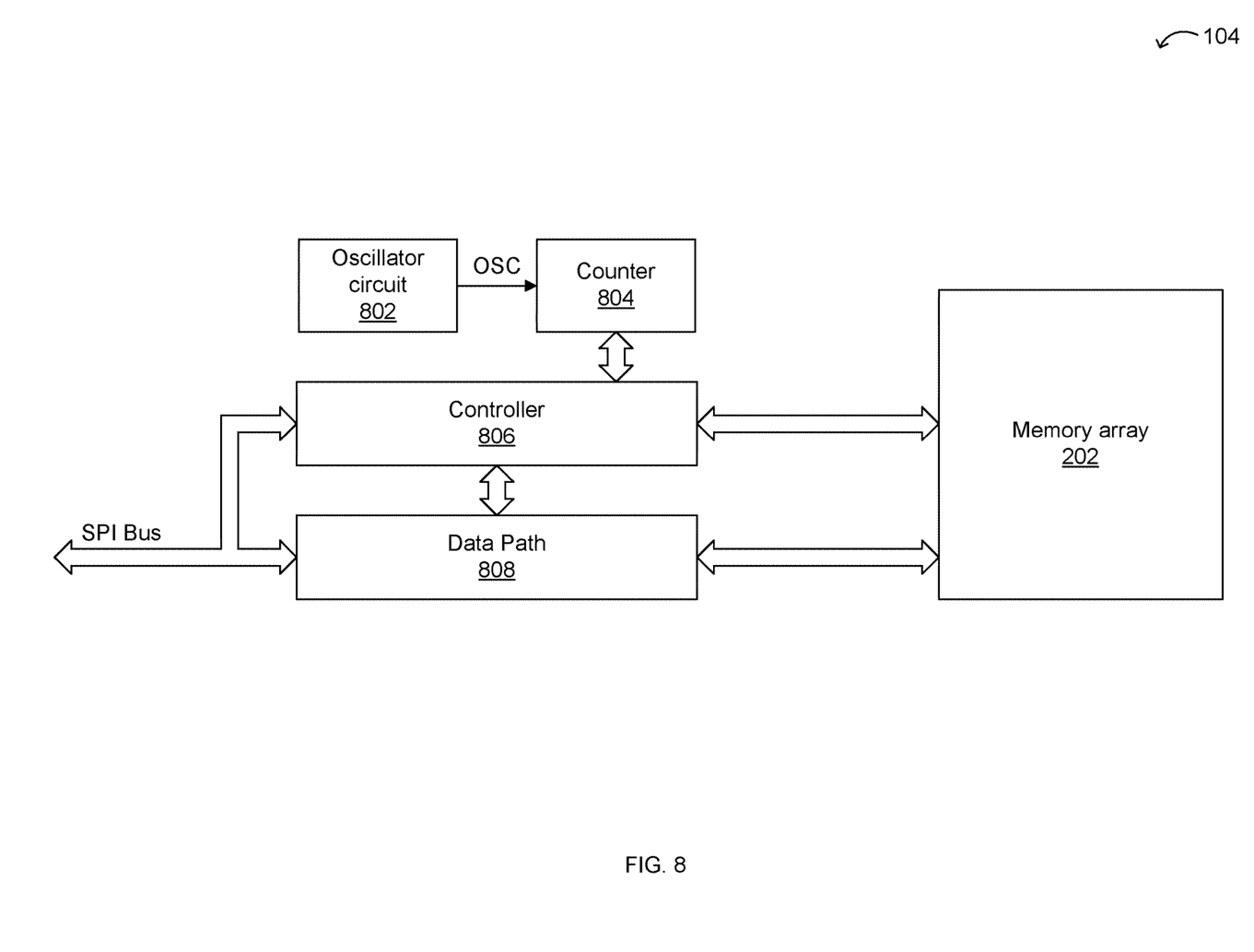
FIG. 8 is a schematic block diagram of an example memory device configured to reduce standby current, in accordance with embodiments of the present invention.

In example 700, the memory device can determine a time duration in which the memory device is in a standby mode at 702. At 704, a comparison can be made to determine if this time duration exceeds a predetermined time duration, such as by counting a predetermined number of cycles. For example, this predetermined time duration to define a "long duration" can be a configuration value that is provided from the host device to the memory device, and/or it can be a default or pre-defined value that comes with the memory device, and in any event may be a value that is stored in a register on the memory device. If this long duration is exceeded, at 706, the memory device can automatically switch itself from the standby mode into a power down mode. The memory device can wake up upon receiving a signal from the host device via the interface (e.g., SPI bus). For example, such signaling can include simply an activation of the chip select signal at 708 and/or detection of a read command at 710. In response, the memory device can exit from the power down mode and wake-up to be ready to receive a command at 712. In addition, the data strobe signal can be deactivated (e.g., driven by the memory device to a logic low or logic high) until data is ready at 714. Once the data is ready to be provided from the memory device in response to the read command, the data strobe can be toggled and the data may be output, at 716. This data strobe toggling can indicate to the host that the read data is ready from the memory device Referring now to FIG. 8, shown is a schematic block diagram of an example memory device configured to reduce standby current, in accordance with embodiments of the present invention. In this particular example, memory device 104 can include oscillator circuit 802, counter 804, controller 806, data path 808, and memory array 202. Oscillator circuit 802 can generate an oscillator signal OSC, which may be provided to counter 804. It should be noted that any suitable continuing oscillating signal (e.g., a system clock if ongoing, etc.) can be employed in order to count a number of cycles to correlate to a time duration. For example, oscillator circuit 802 can be an on-chip oscillator that may also be employed for timing program and erase operations on the memory device, or a separate oscillator circuit. In this example, counting a number of pulses of oscillator signal OSC can be used to determine how long the memory device has been in the standby mode. Controller 806 can compare this time duration against a predetermined time duration to determine whether this standby duration is sufficiently long, and if so, the memory device can automatically switch itself into the power down mode. For example, controller 806 and/or control and protection logic 302 can be employed in order to provide internal signals to switch the memory device into the power down mode.

Figure 9:
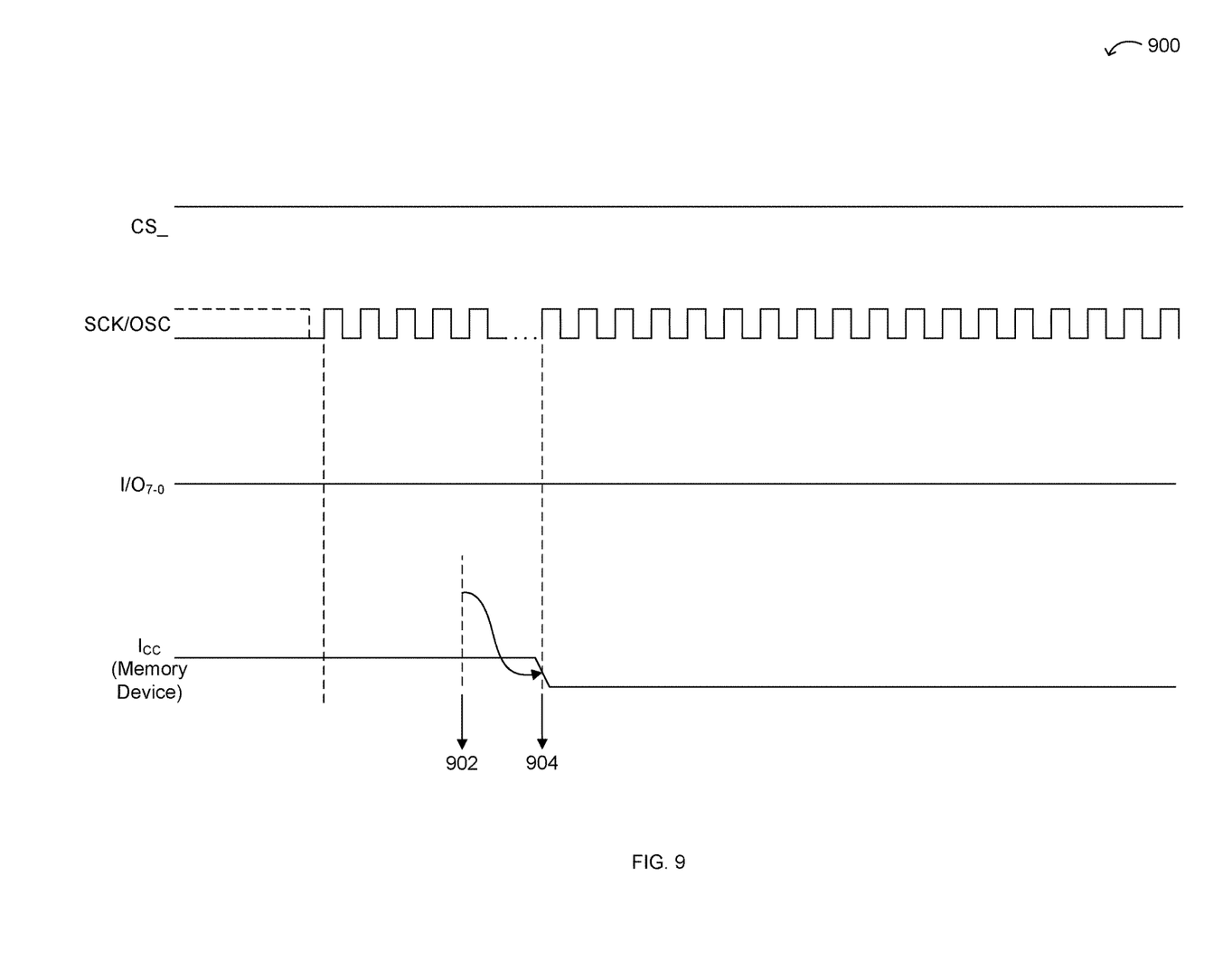
FIG. 9 is a waveform diagram of an example memory device entering power down mode to reduce standby current, in accordance with embodiments of the present invention.

Referring now to FIG. 9, shown is a waveform diagram of an example memory device entering power down mode to reduce standby current, in accordance with embodiments of the present invention. In example 900, the memory device can be in a standby mode until the memory device determines that the time duration of this standby mode is greater than a predetermined duration (e.g., by counting clock pulses) at 902. In this case, the memory device can automatically enter the power down mode at 904. In the power down mode, because various circuits (e.g., charge pumps, band gap reference generators, etc.) can be disabled to save power, the overall memory device current $I_{CC}$ may be reduced, as shown.

Figure 10:
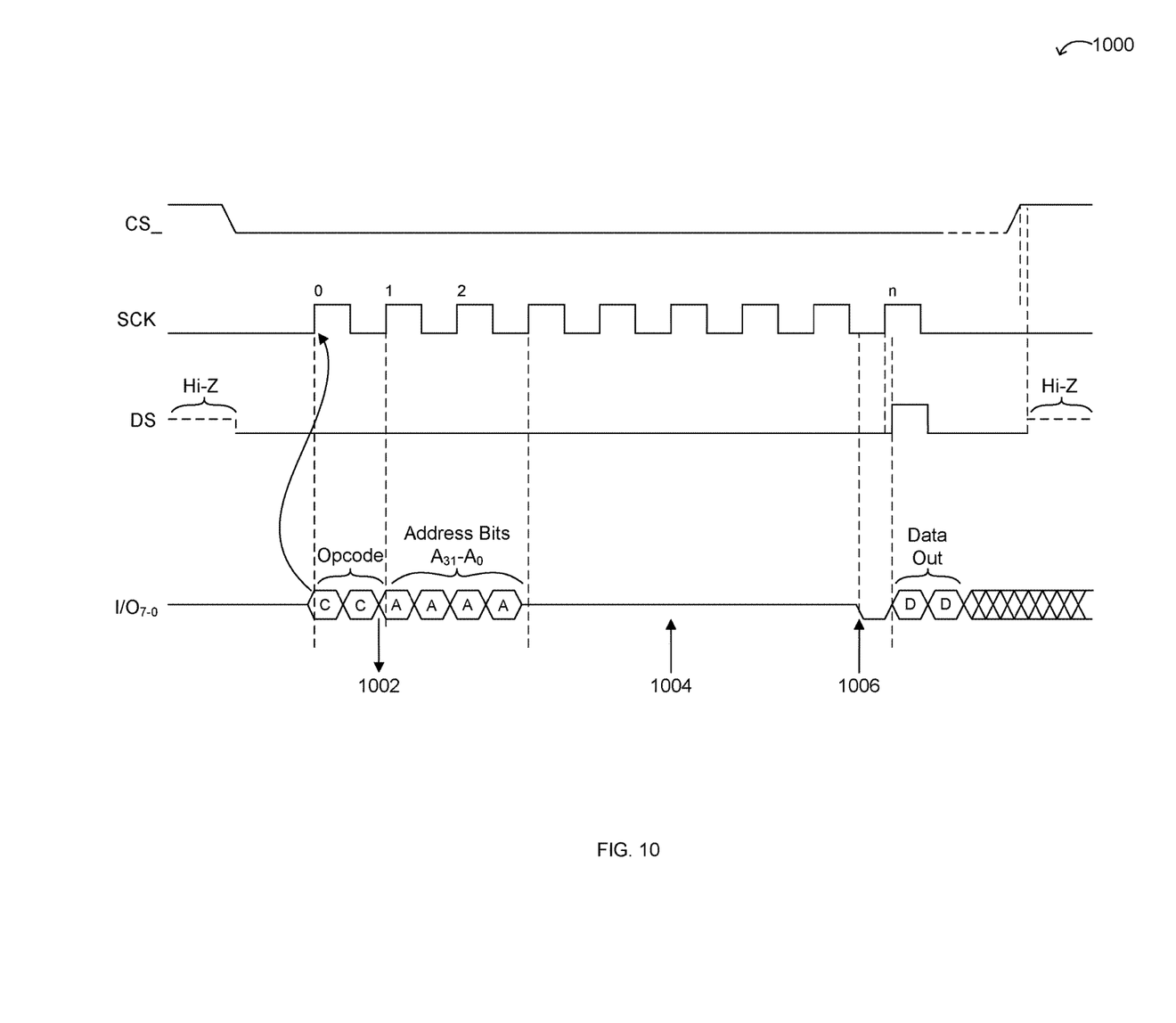
FIG. 10 is a waveform diagram of an example memory device exiting power down mode, in accordance with embodiments of the present invention.

Referring now to FIG. 10, shown is a waveform diagram of an example memory device exiting power down mode, in accordance with embodiments of the present invention. In this case, there may be no change to the host controller, and the NVM may be changed in order to implement the power down mode entry/exit control as described herein. In particular embodiments, the NVM device can detect a read command (or just an active CS) from the host. The NVM can instruct the relevant circuits (e.g., charge pumps, band gap reference generators, etc.) to turn on/be enabled as a result. When the NVM device is ready, the memory device can begin performing the read operation. Throughout the time that the NVM is not ready, the memory device can keep the data strobe (DS) signal as not active (e.g., logic low). As soon as the data is set to become ready from the memory device, the NVM can start toggling the DS to indicate data availability. The host may thus use the data strobe signal as an indication of data availability, as opposed to the host counting a number of dummy cycles to determine data availability.

In example 1000, the memory device can exit from the power down mode by receiving a read command as detected at 1002. This can cause the memory device to begin waking up and powering on all the circuitry that is needed for executing the read operation, and this may be ready to begin at 1004. When data is ready to be output from the memory device to satisfy the read request at 1006, the data strobe signal can toggle in order to indicate to the host device that the data is ready. Once the chip select is de-activated (e.g., goes high), the memory device can return to a standby state, which may include releasing its control on the data strobe signal such that the data strobe is in a high impedance state.

Certain embodiments may be particularly applicable in systems that can tolerate occasional longer latency for some cache misses. However, this situation may be mitigated somewhat by keeping critical code on chip (e.g., on host device 102), and/or by ensuring wake up of the NVM by performing a pre-read at the beginning of a critical code section that is to be executed on the host device.

While the above examples include circuit, operational, and structural implementations of certain memory arrangements and devices, one skilled in the art will recognize that other technologies and/or architectures, as well as other modes of operation, can be used in accordance with embodiments. Further, one skilled in the art will recognize that other device circuit arrangements, architectures, elements, and the like, may also be used in accordance with embodiments. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of controlling a memory device, the method comprising:
   a) determining, by the memory device, a time duration in which the memory device is in a standby mode, wherein the memory device comprises a non-volatile memory;
   b) automatically switching the memory device from the standby mode to a power down mode in response to the time duration exceeding a predetermined duration;
   c) exiting from the power down mode in response to signaling from a host device via an interface, wherein the interface comprises a serial peripheral interface (SPI), and the host device comprises an SPI host controller operable in execute-in-place (XiP) mode to service cache misses from the memory device; and
   d) toggling a data strobe as soon as data is ready to be output from the memory device in response to a read command from the host device, wherein the toggling of the data strobe occurs without the host counting clock cycles to determine data availability from the memory device.

2. The method of claim 1, wherein the signaling from the host device comprises activating a chip select signal on the interface.

3. The method of claim 1, wherein the signaling from the host device comprises an opcode indicating the read command.

4. The method of claim 1, further comprising deactivating the data strobe from a high-impedance state in response to the signaling from the host device, and maintaining the deactivated data strobe until the data is ready to be output from the memory device.

5. The method of claim 1, wherein the determining the time duration comprises counting a number of pulses of a clock signal.

6. The method of claim 5, further comprising generating the clock signal by an oscillator circuit on the memory device.

7. The method of claim 1, wherein the memory device is configured to turn off a read charge pumpand a banddur- ingthe power down mode.

8. A memory device having a non-volatile memory, the memory device comprising:
   a) a counter circuit configured to determine a time duration in which the memory device is in a standby mode;
   b) a controller configured to automatically switch the memory device from the standby mode to a power down mode in response to the time duration exceeding a predetermined duration;
   c) the controller being configured to exit from the power down mode in response to signaling from a host device via an interface, wherein the interface comprises a serial peripheral interface (SPI), and the host device comprises an SPI host controller operable in execute-in-place (XiP) mode to service cache misses from the memory device; and
   d) a data path circuit configured to toggle a data strobe as soon as data is ready to be output from the memory device in response to a read command, wherein the toggle of the data strobe occurs without the host counting clock cycles to determine data availability from the memory device.

9. The memory device of claim 8, wherein the signaling from the host device comprises activating a chip select signal on the interface.

10. The memory device of claim 8, wherein the signaling from the host device comprises an opcode indicating the read command.

11. The memory device of claim 8, wherein the data path circuit is configured to deactivate the data strobe from a high-impedance state in response to the signaling from the host device, and to maintain the deactivated data strobe until the data is ready to be output from the memory device.

12. The memory device of claim 8, wherein the counter circuit is configured to count a number of pulses of a clock signal.

13. The memory device of claim 12, further comprising an oscillator circuit configured to generate the clock signal.

14. The memory device of claim 8, being configured to turn off a read charge pump and a band gap reference generator during the power down mode.

* * * * *